United States Patent [19]

Sugawa et al.

[11] Patent Number: 4,847,668
[45] Date of Patent: Jul. 11, 1989

[54] DEVICE AND METHOD OF PHOTOELECTRICALLY CONVERTING LIGHT INTO ELECTRICAL SIGNAL

[75] Inventors: Shigetoshi Sugawa, Atsugi; Nobuyoshi Tanaka, Tokyo; Toshiji Suzuki, Machida; Tadahiro Ohmi, Sendai; Tadanori Harada, Atsugi, all of Japan

[73] Assignee: Canon Kabushiki Kaisha, Tokyo, Japan

[21] Appl. No.: 275,673

[22] Filed: Nov. 23, 1988

[30] Foreign Application Priority Data

Nov. 13, 1985 [JP] Japan ................................. 60-252654
Nov. 29, 1985 [JP] Japan ................................. 60-269873

[51] Int. Cl.$^4$ ........................ H01L 27/14; H01L 31/00
[52] U.S. Cl. ........................................ 357/30; 357/34; 357/40; 357/45
[58] Field of Search ................. 357/30 G, 30 L, 30 R, 357/30 P, 30 H, 40, 34, 36, 45, 46, 50, 51; 307/299.1, 299.2, 457, 299.3, 311

[56] References Cited

U.S. PATENT DOCUMENTS 4,686,554  8/1987  Ohmi ..................................... 357/30
4,731,665  3/1988  Hashimoto ..................... 358/215.27

*Primary Examiner*—William L. Sikes
*Assistant Examiner*—Georgia Y. Epps
*Attorney, Agent, or Firm*—Fitzpatrick, Cella, Harper & Scinto

[57] ABSTRACT

A photoelectric transducer device controls a potential of a control electrode region of a semiconductor transistor through a capacitor to perform a storage operation for storing carriers generated upon light excitation of the control electrode region, a read operation for reading a signal from a main electrode region of the semiconductor transistor, the signal being controlled by a storage voltage generated by storage of the carriers, and a refresh operation for electrically neutralizing the carriers stored in the control electrode region. A semiconductor reigon having the same conductivity type as that of the main electrode region and having an impurity concentration lower than that of the main electrode region is formed in the control electrode region independently of the main electrode region. A photoelectric transducer device including a semiconductor region. Two main electrodes and a control electrode are formed between the main electrodes. A capacitor is provided for controlling a potential of the control electrode in a floating state. The photoelectric transducer device is adapted to control the potential of the control electrode in the floating state through the capacitor to store carriers generated by electromagnetic waves incident on the semiconductor region. Control means is provided for controlling the potential of the control electrode through the capacitor to electrically neutralize the carriers and means for injecting carriers into the control electrode immediately prior to electrical neutralization of the carriers by the control means is provided.

7 Claims, 13 Drawing Sheets

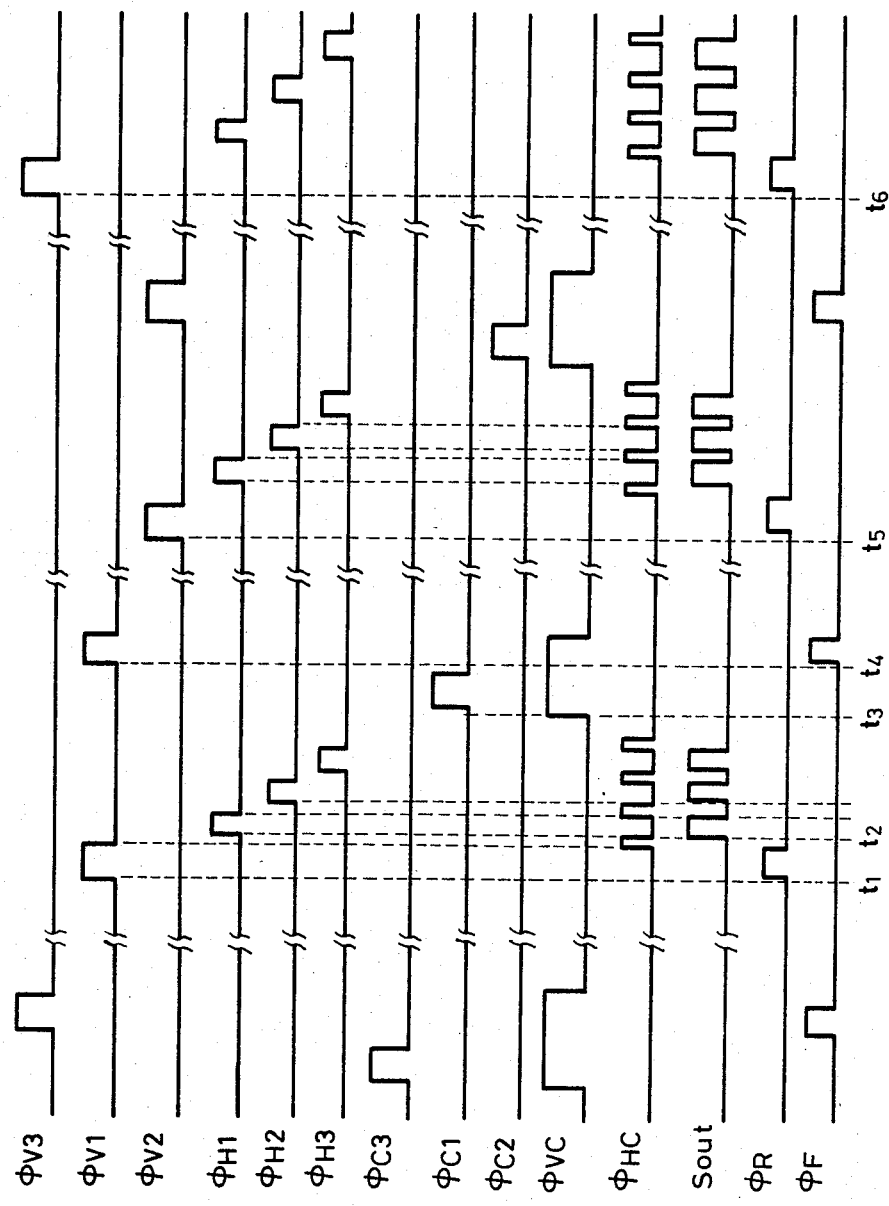

DEVICE AND METHOD OF PHOTOELECTRICALLY CONVERTING LIGHT INTO ELECTRICAL SIGNAL'

This application is a continuation of application Ser. No. 099,670 filed Sept. 21, 1987 which is a continuation of application Ser. No. 929,479 filed Nov. 12, 1986, now abandoned.

BACKGROUND OF THE INVENTION

1. Field of the Invention

The present invention relates to a device and method for photoelectrically converting light into an electrical signal wherein a potential at a control electrode region of a semiconductor transistor is controlled through a capacitor to store carriers excited by means of light in the control electrode region, thereby controlling an output from the semiconductor transistor.

2. Related Background Art

FIG. 1A is a plan view of a photoelectric transducer device described in European Patent Provisional Publication No. 132076, FIG. 1B is a sectional view of the device taken along the line I—I thereof, and FIG. 1C is a diagram of an equivalent circuit thereof.

Referring to FIGS. 1A to 1C, photoelectric transducer cells are arranged on an n-type silicon substrate 101. The photoelectric transducer cells are electrically insulated by an element isolation region 102 made of $SiO_2$, $Si_3N_4$ or polysilicon.

Each photoelectric transducer cell has the following construction. A p-type impurity is doped to form a p-type region 104 on an $n^-$-type region 103 having a low impurity concentration formed by an epitaxial technique or the like. An $n^+$-type region 105 is formed in the p-type region 104 by impurity diffusion or ion implantation. The p- and $n^+$-type regions 104 and 105 serve as the base and emitter of each bipolar transistor.

An oxide film 106 is formed on the $n^-$-type region 103. A capacitor electrode 107 having a predetermined area is formed on the oxide film 106. The capacitor electrode 107 opposes the p-type region 104, interposing the oxide film 106 therebetween, thereby constituting a capacitor $C_{ox}$. Upon application of a pulse voltage to the capacitor electrode 107, the potential of the p-type region 104 in the floating state is controlled.

An emitter electrode 108 connected to the $n^+$-type region 105, a wire 109 for extracting the signal from the emitter electrode 108, and a wire 110 connected to the capacitor electrode 107 are formed at the upper surface side of the substrate 101. An $n^+$-type region 111 having a high impurity concentration and an electrode 112 for applying a voltage to the collector of a bipolar transistor are sequentially formed on the lower surface of the substrate 101.

The basic operation of the photoelectric transducer device will be described below. Assume that the p-type region 104 as the base region of the bipolar transistor is set in the initial state of a negative potential. Light 113 is incident on the p-type region 104 and carriers corresponding to the amount of light are stored in the p-type region 104 (storage operation). The base potential is changed by the charged carriers. The change in base potential controls a current supplied to an emitter-collector path, and an electrical signal having a level corresponding to the amount of incident light is extracted from the floating emitter electrode 108 (read operation). In order to remove the carriers stored in the p-type region 104, the emitter electrode 108 is grounded and a refresh positive voltage pulse is supplied to the capacitor electrode 107. Upon application of this positive voltage, the p-type region 104 is forward-biased with respect to the $n^+$-type region 105, thereby removing the charged carriers. When the refresh pulse falls, the p-type region 104 returns to the initial state of the negative potential (refresh operation). The cycle of storage, read, and refresh operations is repeated.

According to the method proposed here, the carriers generated upon reception of light are stored in the p-type region 104 as the base region, and the current supplied between the emitter and collector electrodes 108 and 112 is controlled by the stored carriers. Therefore, the stored carriers are amplified by the amplification function of each cell, and the amplified carriers are read out. Therefore, a high output with high sensitivity and low noise can be obtained.

A potential Vp generated by the base by the carriers stored in the base upon light excitation is given by Q/C where Q is the charge of the carriers stored in the base, and C is the capacitance connected to the base. As is apparent from the above mathematical expression, both Q and C are reduced according to the reduction of the cell size when the transducer device is highly integrated. It is thus found that the potential Vp generated by light excitation is kept substantially constant. Therefore, the method proposed by the above prior art is advantageous in a future high-resolution implementation.

A change in base potential Vb during the application of the positive refresh voltage to the capacitor electrode 107 is given as follows:

$$(Cox + Cbe + Cbc)dVb/dt = -Ib$$

where Cbe is the capacitance between the base and emitter of the bipolar transistor, Cbc is the capacitance between the base and collector thereof, and Ib is the base current.

FIG. 2 is a graph showing changes in base potential Vb during the application of the positive refresh voltage as a function of time.

Referring to FIG. 2, the initial base potential at the time of the application of the refresh pulse varies according to the magnitude of the storage voltage Vp. The negative potential in the initial state is changed in the positive direction by the storage voltage Vp upon the storage operation. In this state, when the positive refresh pulse is applied to the capacitor electrode 107, the initial base potential is increased by the storage voltage Vp.

As is also apparent from the graph in FIG. 2, the time for maintaining the initial base potential varies according to the magnitude of the initial base potential. However, after the lapse of this period, the base potential Vb is decreased at a constant rate regardless of the initial base potential. If the refresh time t is sufficiently long, the base potential Vb can be controlled to be substantially 0 V regardless of the magnitude of the storage voltage Vp. Therefore, the base potential Vb returns to the predetermined negative potential of the initial state when the refresh pulse falls.

However, in order to achieve high-speed operation, the refresh operation is terminated at the refresh time $t = t0$ and the base potential $Vb = Vk$ in practice. Even if a residual potential of the base potential Vb is present, the base potential Vb can return to the predetermined negative potential when the refresh pulse falls under the conditions wherein the refresh time t=t0 is established and the base potential Vb is constantly the predetermined potential Vk. Therefore, the negative potential can be set to be the initial state.

However, in the conventional photoelectric transducer device described above, when the refresh operation is repeated, the residual potential Vk is gradually decreased and undesirably causes an after-image phenomenon.

Referring to FIG. 2, assume that the initial base potential of a cell receiving a large amount of light is 0.8 V and that the initial base potential of a cell receiving a small amount of light is 0.4 V. When the refresh time the has elapsed, the base potential Vb of the cell receiving a large amount of light becomes the predetermined residual potential Vk. However, the base potential Vb of the cell receiving a small amount of light becomes a residual potential Vl lower than the predetermined residual potential Vk. In this state, if the refresh pulse rises, the base potential Vb of the cell receiving a small amount of light becomes lower than the negative potential of the initial state. From a potential lower than the initial negative potential, storage and read operations are started. Therefore, if the refresh operation is repeated in a low illuminance state, the residual potential of the base is gradually decreased. Even if a high illuminance state is obtained, the resultant output has a level lower than that corresponding to the amount of incident light. In other words, the after image phenomenon occurs due to the following reason.

When the refresh operation is repeated, the holes in the base region are recombined to result in their shortage. If the shortage of holes cannot be compensated for a long period of time, i.e., if the low illuminance state continues for a long period of time, the after image phenomenon typically occurs.

In a conventional photoelectric transducer device, if its cells are arranged in a matrix form, the following blooming phenomenon also occurs undesirably.

FIG. 3 is a schematic circuit diagram of an area sensor using a conventional photoelectric transducer device. Referring to FIG. 3, conventional photoelectric transducer cells 120 of a 3×3 matrix are arranged in the area sensor. Emitter electrodes 108 of the cells 120 are connected to corresponding vertical lines in units of columns. Capacitor electrodes 107 are connected to horizontal lines in units of rows. A positive voltage from a vertical scanning unit 121 is applied to the photoelectric transducer cells 120 to perform read access or refresh operation in units of rows.

If a given photoelectric transducer cell receives a large amount of light and the potential of the base region 104 is higher than that of the corresponding emitter region 105, the potential of the vertical line connected to this emitter electrode 108 is increased although read access is not performed. If other photoelectric transducer cells, the emitter electrodes 105 of which are connected to the same vertical line, are subjected to read access, a readout signal is output to the corresponding vertical line although the given cell does not receive light. In other words, the blooming phenomenon occurs along the vertical direction.

SUMMARY OF THE INVENTION

It is an object of the present invention to provide a device and method of photoelectrically converting light into an electrical signal so as to eliminate the conventional drawbacks in consideration of the situation described above.

It is another object of the present invention to provide a device and method of photoelectrically converting light into an electrical signal, wherein a residual potential is not decreased even if refresh operation is repeated, and an after image phenomenon can be eliminated.

It is still another object of the present invention to provide a photoelectric transducer device capable of maintaining initial photoelectric conversion characteristics even if photoelectric conversion is repeated at high speed.

It is still another object of the present invention to provide a photoelectric transducer device free from the blooming phenomenon.

It is still another object of the present invention to provide a photoelectric transducer device for controlling a potential of a control electrode region of a semiconductor transistor through a capacitor to perform a storage operation for storing carriers generated upon light excitation of the control electrode region, a read operation for reading a signal from a main electrode region of the semiconductor transistor, the signal being controlled by a storage voltage generated by storage of the carriers, and a refresh operation for electrically neutralizing the carriers stored in the control electrode region, wherein a semiconductor region having the same conductivity type as that of the main electrode region and having an impurity concentration lower than that of the main electrode region is formed in the control electrode region independently of the main electrode region.

It is still another object of the present invention to provide a photoelectric transducer device including a semiconductor region provided with two main electrodes and a control electrode formed between the main electrodes and with a capacitor for controlling a potential of the control electrode in a floating state, the photoelectric transducer device being adapted to control the potential of the control electrode in the floating state through the capacitor to store carriers generated by electromagnetic waves incident on the semiconductor region, comprising: control means for controlling the potential of the control electrode through the capacitor to electrically neutralize the carriers; and means for injecting carriers into the control electrode immediately prior to electrical neutralization of the carriers by the control means.

Figure 4A:
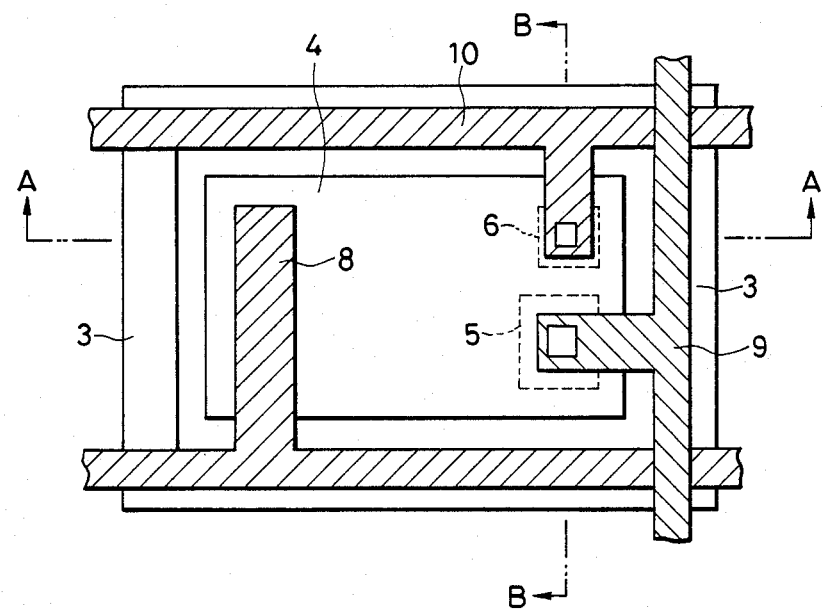
FIG. 4A is a schematic plan view showing a photoelectric transducer device according to an embodiment of the present invention.
Figure 5A:
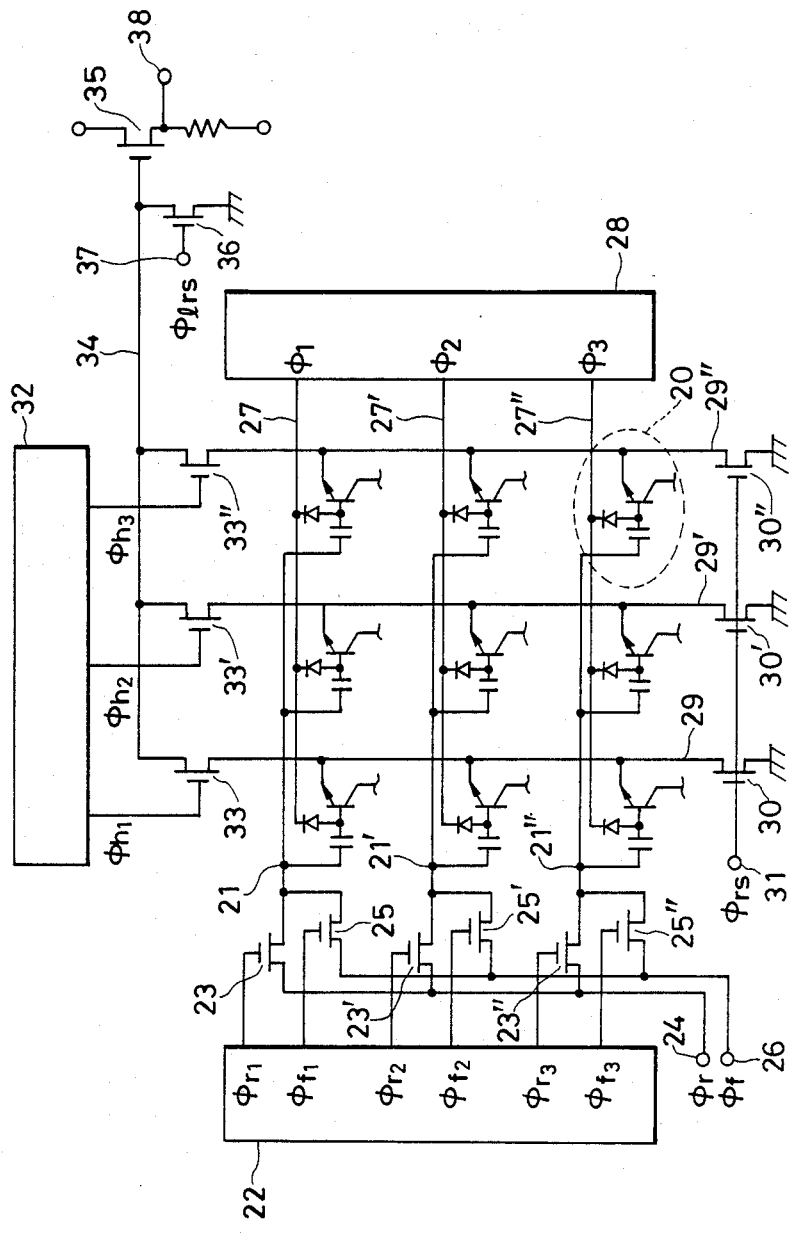
Figure 5B:
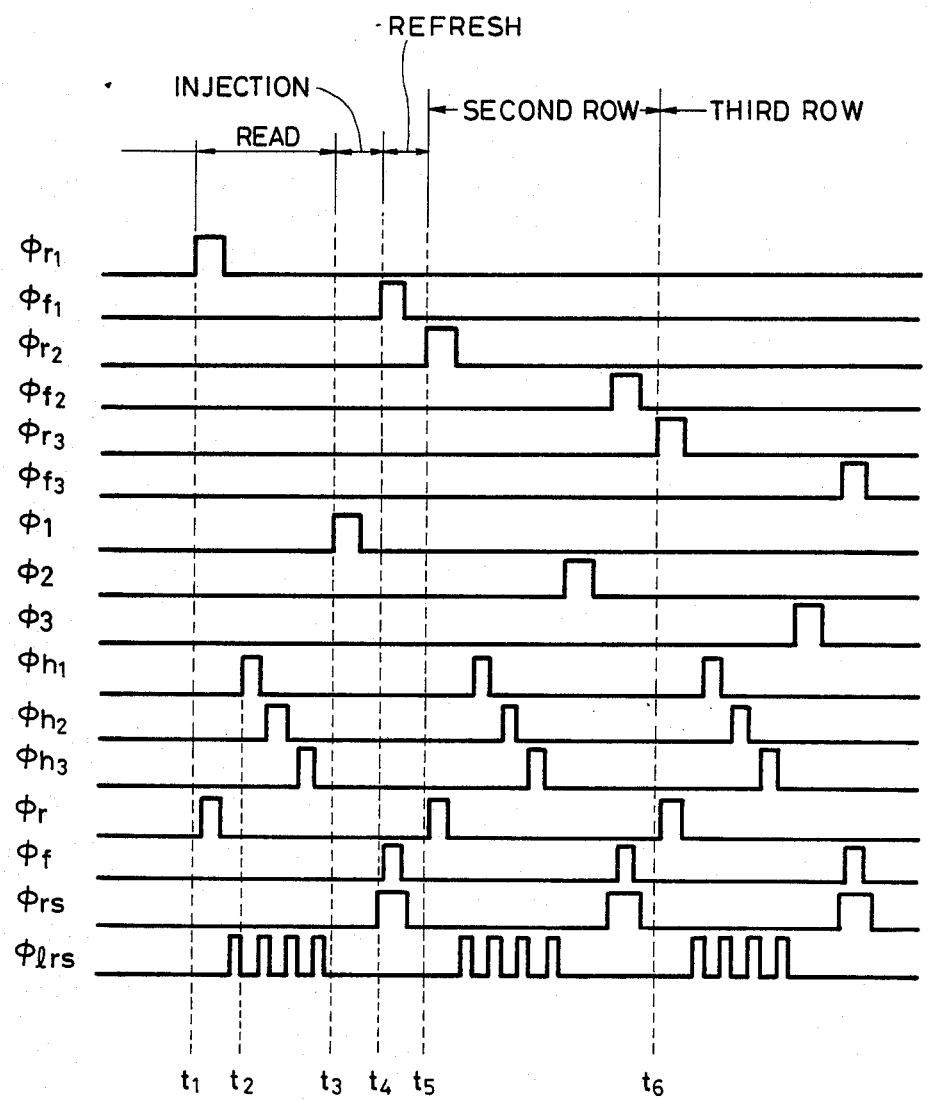
Figure 6A:
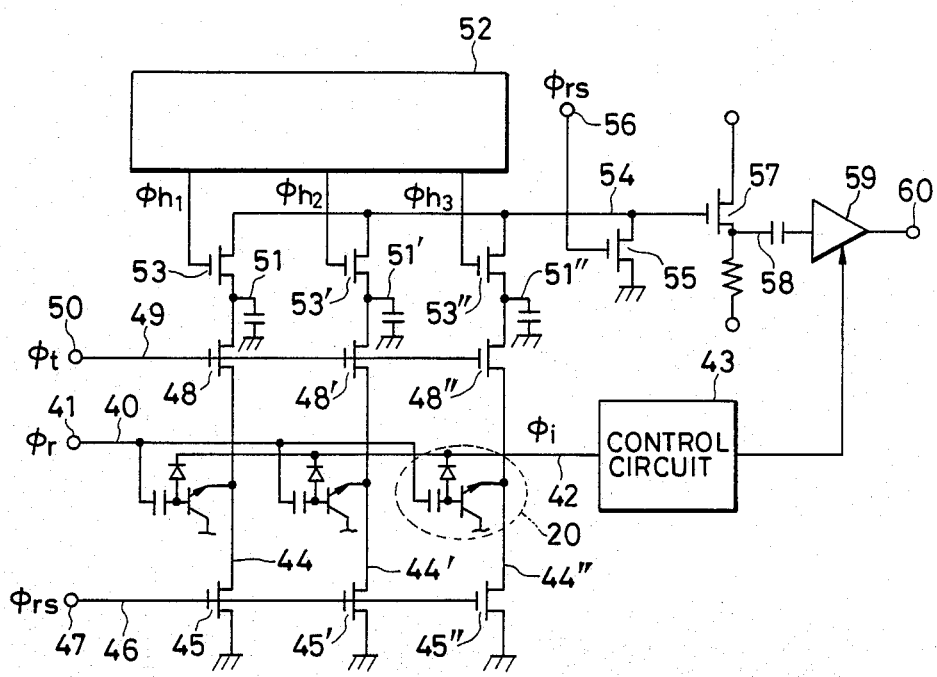
Figure 6B:
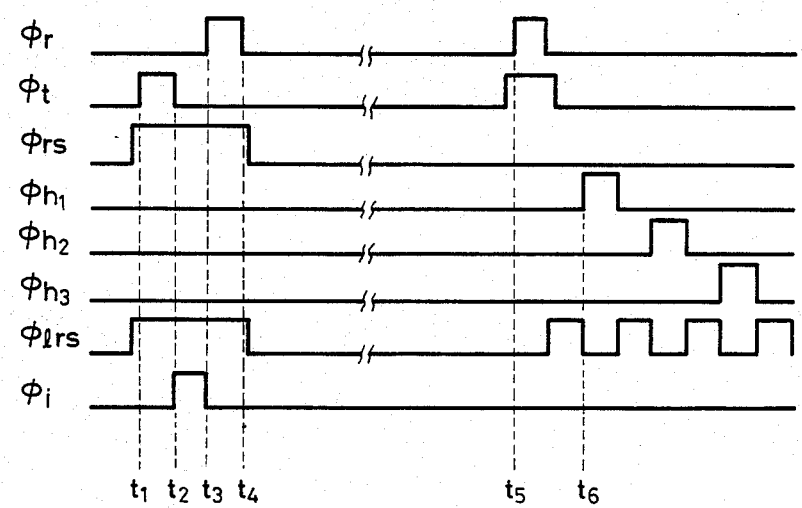
Figure 7A:
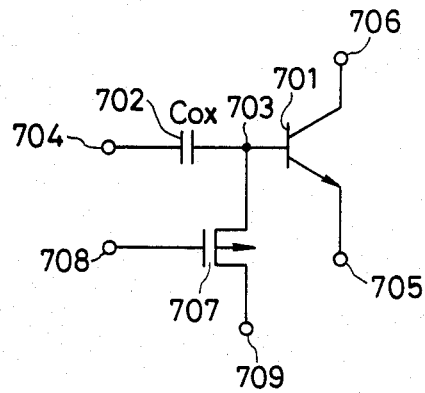
Figure 7B:
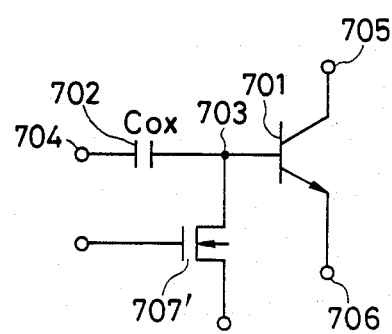
Figure 7C:
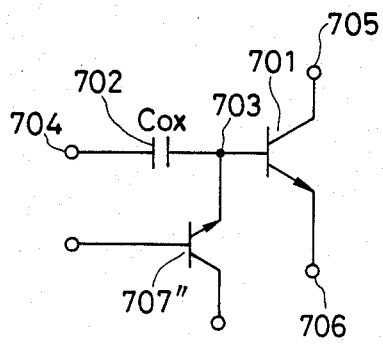
Figure 7D:
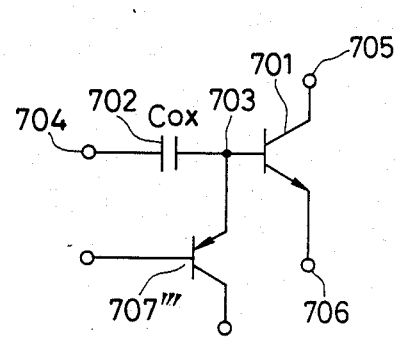
Figure 8A:
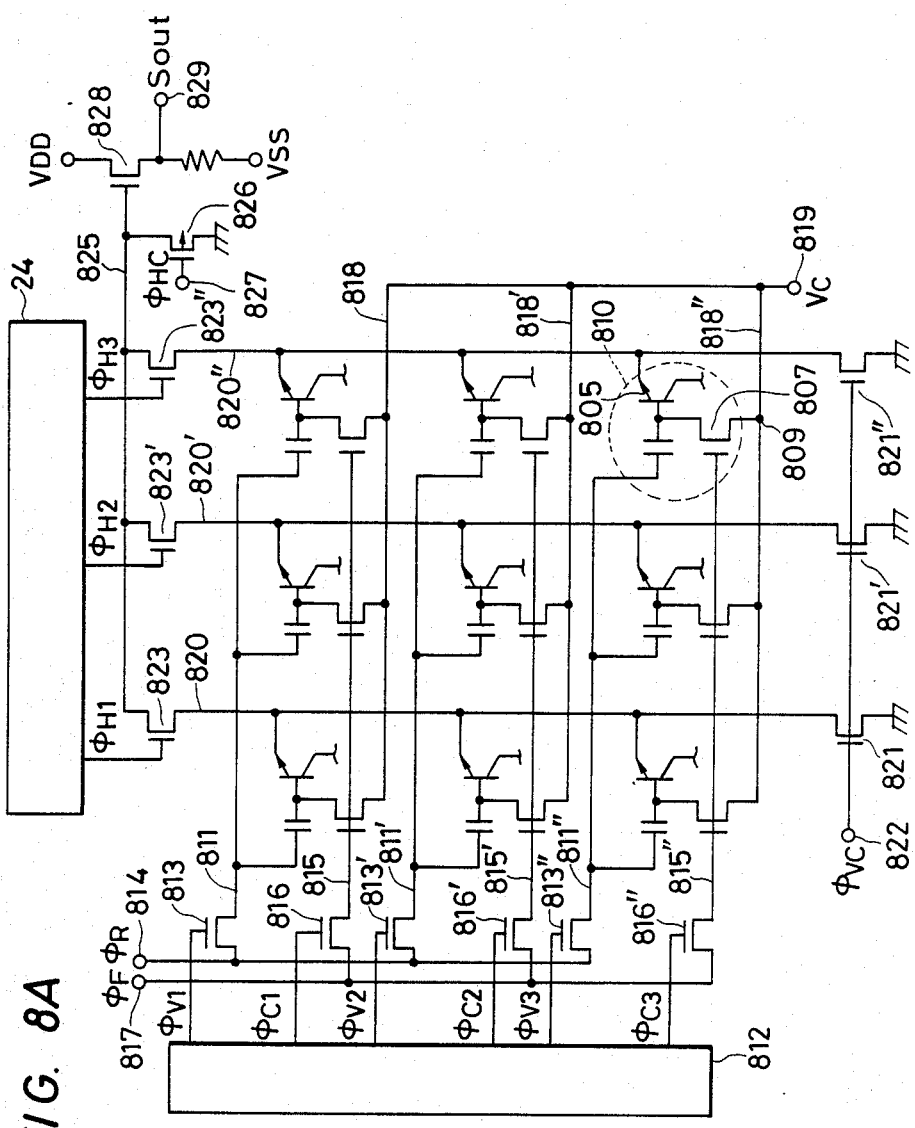
Figure 9A:
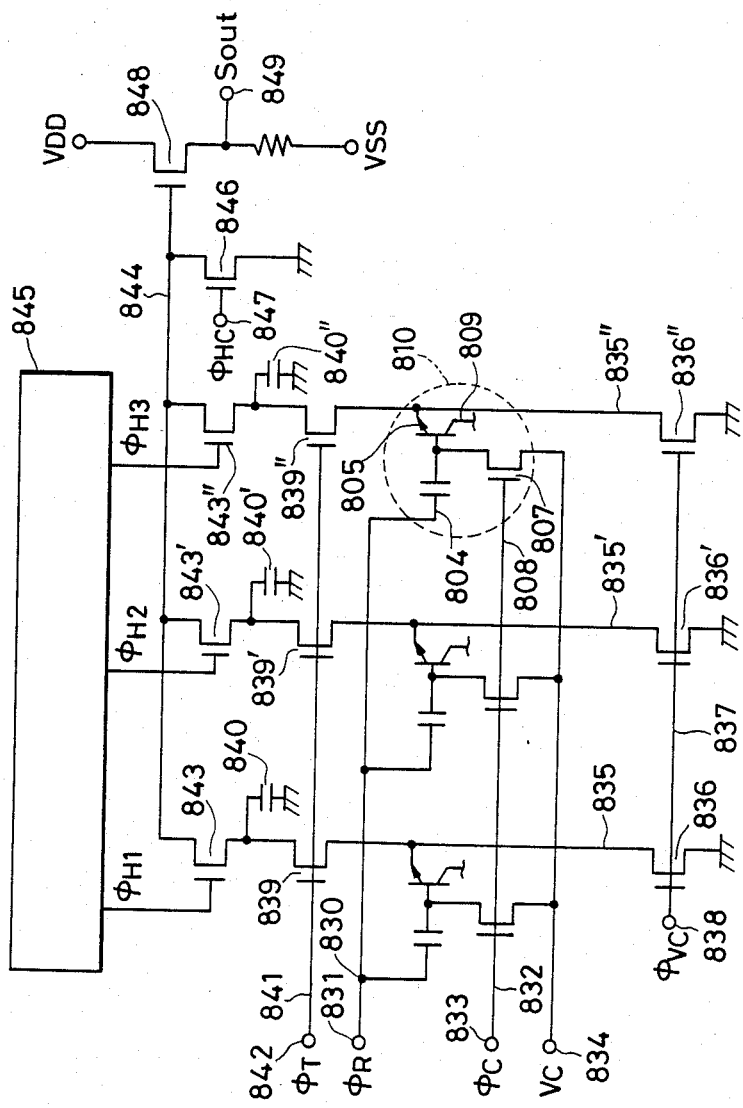
Figure 9B:
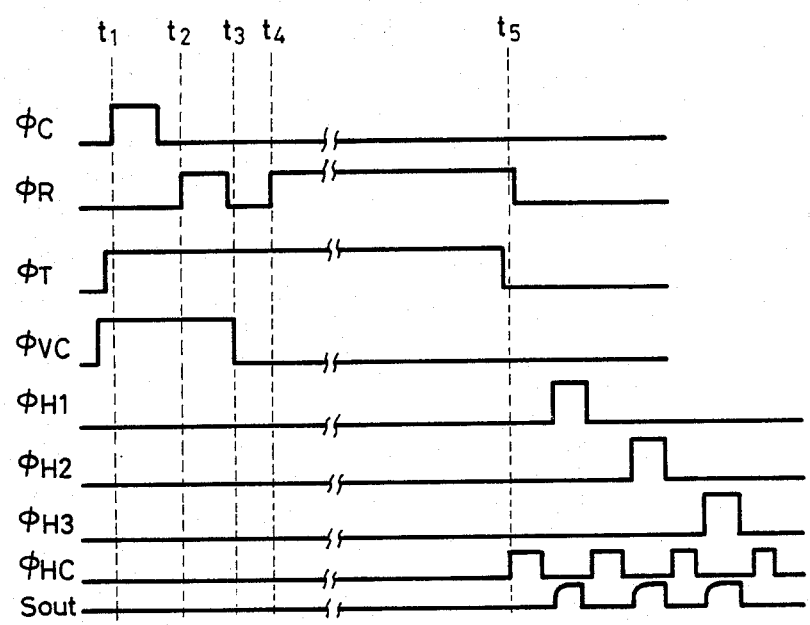
Figure 9C:
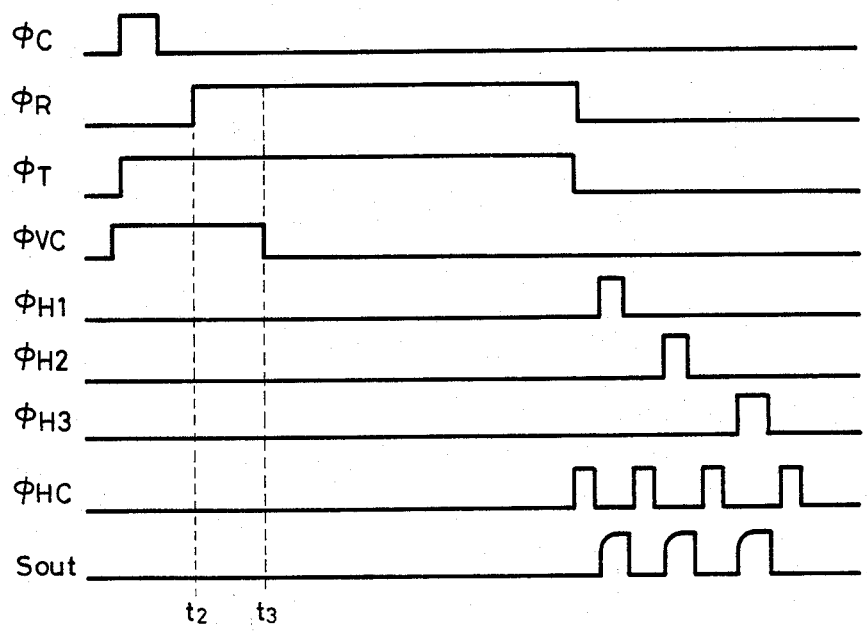
Figure 9D:
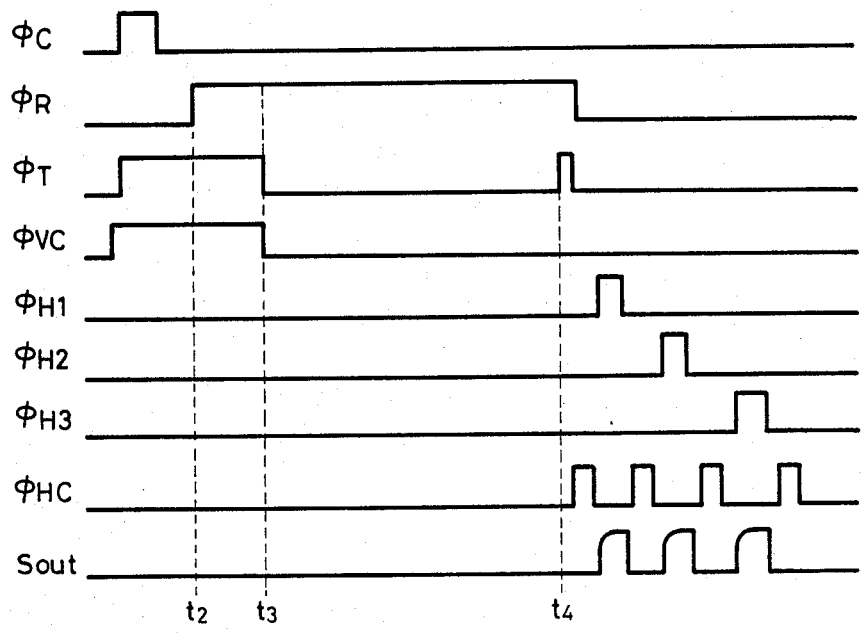

4D is an equivalent circuit diagram of the device in FIG. 4A;

FIG. 5A is a circuit diagram of an image pickup device using the embodiment of the present invention, and FIG. 5B is a timing chart for explaining the operation of the image pickup device in FIG. 5A;

FIG. 6A is a circuit diagram of another image pickup device using the embodiment of the present invention, and FIG. 6B is a timing chart for explaining the operation of the image pickup device in FIG. 6A;

FIG. 7A is an equivalent circuit diagram of a photoelectric transducer device according to another embodiment of the present invention, and FIGS. 7B to 7D are respectively equivalent circuit diagrams of photoelectric transducer devices according to other embodiments of the present invention;

FIG. 8A is a circuit diagram of a two-dimensional image pickup device using photoelectric transducer devices according to still another embodiment of the present invention, and FIG. 8B is a timing chart for explaining the operation of the image pickup device in FIG. 8A; and FIG. 9A is a circuit diagram of a one-dimensional image pickup device using photoelectric transducer devices according to still another embodiment of the present invention, FIG. 9B is a timing chart for explaining an operation of the image pickup device in FIG. 9A, FIG. 9C is a timing chart for explaining another operation of the image pickup device in FIG. 9A, and 9D is a timing chart for explaining still another operation of the embodiment as shown in FIG. 9A.

DETAILED DESCRIPTION OF THE PREFERRED EMBODIMENTS

Preferred embodiments of the present invention will be described with reference to the accompanying drawings below.

Figure 4B:
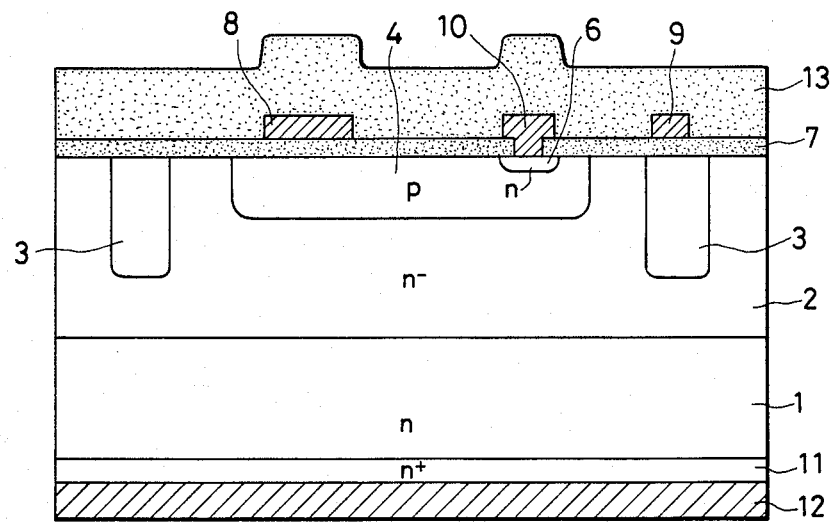
FIG. 4B is a sectional view of the device in FIG. 4A taken along the line A—A thereof.
Figure 4C:
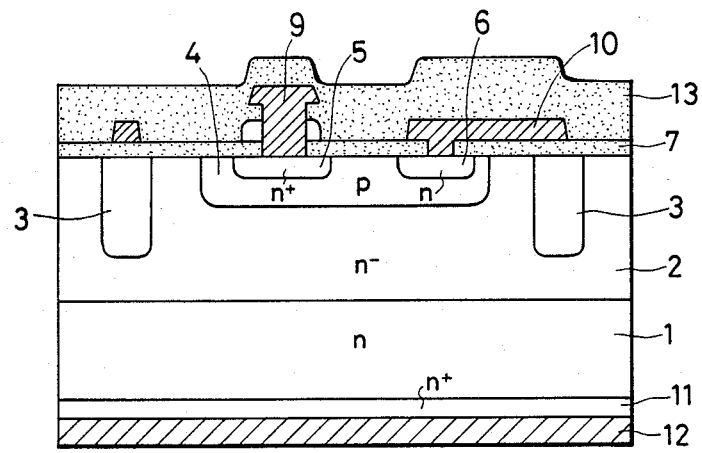
FIG. 4C is a sectional view of the device in FIG. 4A taken along the line B—B thereof, and FIG.
Figure 4D:
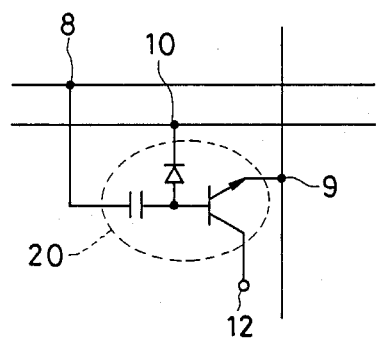

FIG. 4A is a plan view of a photoelectric transducer device according to an embodiment of the present invention, FIG. 4B is a sectional view of the device taken along the line A—A thereof, FIG. 4C is a sectional view of the device taken along the line B—B thereof, and FIG. 4D is an equivalent circuit diagram of the device.

Referring to FIGS. 4A to 4C, an $n^-$-type epitaxial layer 2 is formed on an n-type silicon substrate 1. Photoelectric transducer elements electrically isolated from each other by an element isolation region 3 are arranged. Note that the element isolation region 3 comprises an $SiO_2$, $Si_3N_4$, polysilicon or $n^+$-type diffusion region.

A p-type base region 4 of a bipolar transistor is formed on the $n^-$-type epitaxial layer 2 by impurity diffusion or ion implantation. An $n^+$-type emitter region 5 and an n-type region having the same impurity concentration as that of the p-type base region 4 are formed in the p-type base region 4 by impurity diffusion or ion implantation. The n-type region 6 and the p-type base region 4 constitute a diode structure.

An oxide film 7 is formed on the $n^-$-type epitaxal layer 2, and a capacitor electrode 8 made of polysilicon or the like is formed on the oxide film 7 to supply a pulse to the p-type base region 4.

An emitter electrode 9 connected to the $n^+$-type emitter region 5, and an electrode 10 connected to the n-type region 6 are formed on the oxide film 7 formed on the substrate 1. An $n^+$-type region 11 and a collector electrode 12 are sequentially formed on the lower surface of the substrate 1. A protective film 13 is formed to cover each photoelectric transducer cell.

In order to form the diode structure constituted by the control electrode region and the semiconductor region, a proper voltage is applied to the semiconductor region, and thus carriers are injected in the control electrode. For this reason, the potential of the control electrode region at the beginning of refresh operation can be kept sufficiently high. As a result, the potential of the control electrode region at the end of refresh operation can be kept at a desired value, and thus the after image phenomenon can be prevented, unlike in the conventional structure.

Even if strong radiation is applied to the photoelectric transducer cell, the excessive carriers can be eliminated through the diode structure. Therefore, the blooming phenomenon can be prevented.

The operation of the photoelectric transducer device having the structure described above will be described below.

In the storage operation, the p-type base region is kept at a negative potential of the initial state, the emitter region 5 is set at zero potential in the floating state, the capacitor electrode 8 is set at zero potential, and the n-type region 6 is set at zero or a negative potential with a very small magnitude. Thereafter, the collector electrode 12 is kept at the positive potential. In this state, light is incident on each photoelectric transducer element, carriers (holes in this case) corresponding to the amount of incident light are stored in the p-type base region 4.

When the potential of the p-type base region 4 is increased upon reception of strong light, the diode formed by the p-type base region 4 and the n-type region 6 is forward-biased. The holes excessively stored in the p-type base region are eliminated outside through the electrode 10. Therefore, the potential of the $n^+$-type emitter region 5 is not changed, and no blooming phenomenon occurs.

In the read operation, the $n^+$-type emitter region 5 and the n-type region 6 are maintained in the floating state. A positive read voltage pulse is applied to the capacitor electrode 8. As described above, an electrical signal corresponding to the amount of light incident on the emitter electrode 9 is read out.

In the hole injection operation, the capacitor electrode 8 is set at zero potential, and the $n^+$-type emitter region 5 is kept in the floating state. A proper positive potential is applied to the n-type region 6 constituting the diode to reverse-bias the diode so that a depletion layer extends up to the electrode 10. The extended depletion layer causes punch-through, and thus the holes are injected into the p-type base region through the n-type region 6. The potential of the p-type base region 4 is increased.

Figure 1A:
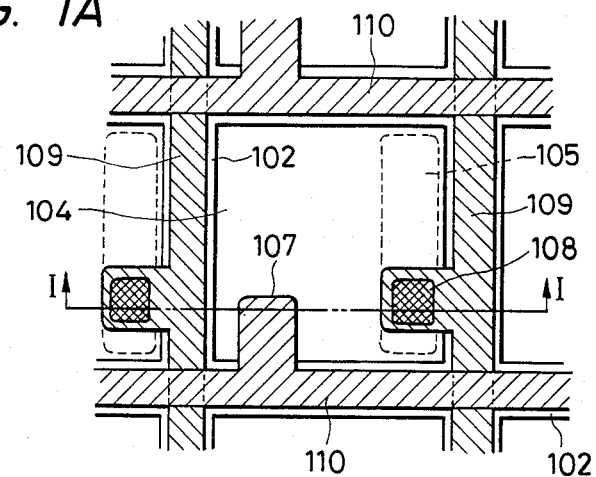
FIG. 1A is a schematic plan view of a photoelectric transducer device described in European Patent Provisional Publication No. 132076.
Figure 1B:
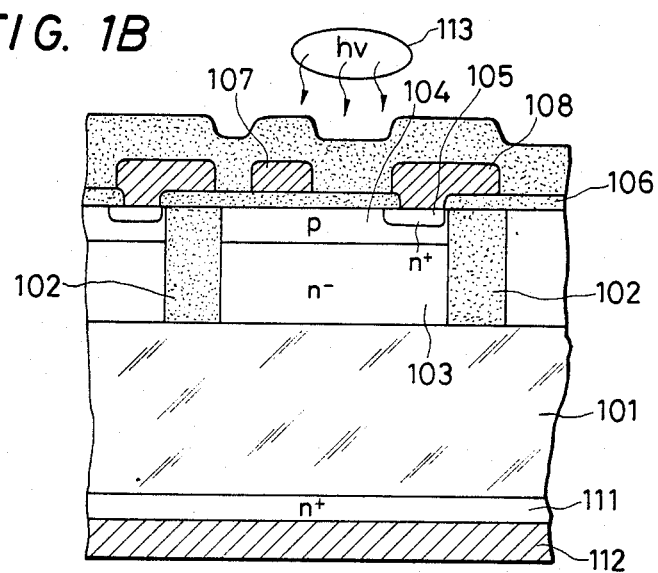
FIG. 1B is a sectional view of the device in FIG. 1A taken along the line I—I thereof.
Figure 1C:
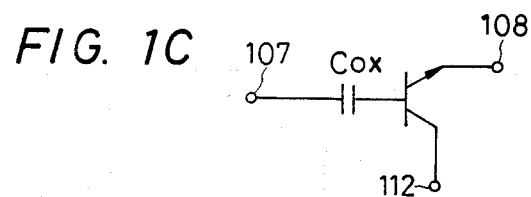
FIG. 1C is an equivalent circuit diagram of the device in FIG. 1A.
Figure 2:
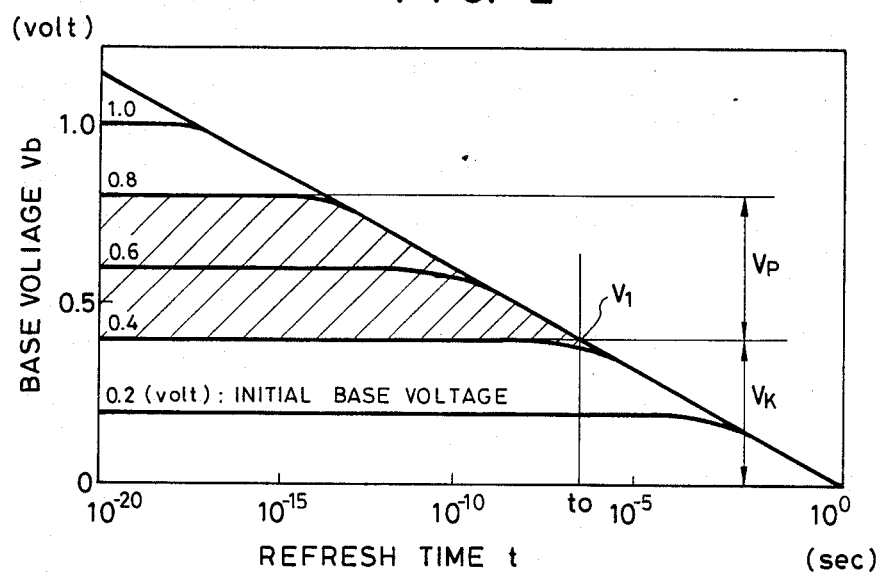
FIG. 2 is a graph showing changes in base potential during refresh operation as a function of time.
Figure 3:
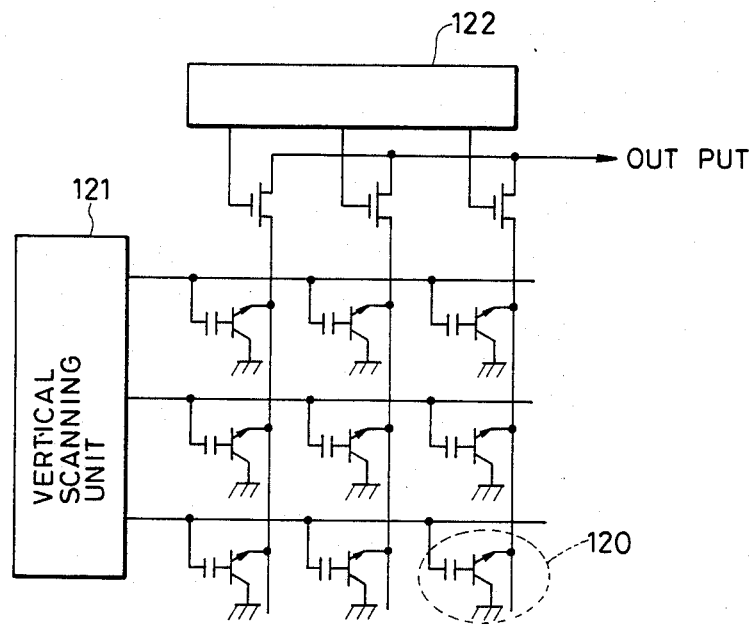
FIG. 3 is a circuit diagram of an image pickup device using the photoelectric transducer device described in European Patent Provisional Publication No. 132076.

In the refresh operation, the $n^+$-type emitter region 5 and the n-type region 6 are grounded. In this state, when a positive refresh voltage pulse is applied to the capacitor electrode 8, the holes stored in the p-type base region 4 are eliminated through the $n^+$-type emitter region 5 and the n-type region 6. It should be noted since the potential of the p-type base region 4 is sufficiently high by the hole injection operation, the initial base potential upon application of the refresh pulse is sufficiently higher than the residual potential Vk although this cell is hole in the dark state (FIG. 2). After the lapse of the refresh time t0, the potential at the p-type base region 4 can be kept at the predetermined potential Vk regardless of the amount of the light. In this state, if the positive refresh voltage pulse falls, the p-type base region 4 is kept at the predetermined initial negative potential.

By performing the hole injection operation, repetition of the refresh operation does not cause shortage of holes in the p-type base region 4. Therefore, the after image phenomenon occurring in the low illuminance state can be completely prevented.

An image pickup device having a two-dimensional configuration of photoelectric transducer cells having the above structure and operated as described above will be described with reference to the accompanying drawings.

FIG. 5 is a circuit diagram of an image pickup device having the two-dimensional configuration of photoelectric transducer devices, and FIG. 5B is a timing chart for explaining the operation thereof.

Referring to FIG. 5A, photoelectric transducer cells 20 are arranged in a 3×3 matrix. Capacitor electrodes 8 of the cells 20 are respectively connected to horizontal lines 21, 21′ and 21″ in units of rows. Each horizontal line is connected to a terminal 24 through transistors 23, 23′ and 23″. A positive read voltage pulse $\phi r$ is applied to the terminal 24. Each horizontal line is also connected to a terminal 26 through transistors 25, 25′ and 25″. A positive refresh voltage pulse $\phi f$ is applied to the terminal 26.

Pulse signals $\phi r1$ to $\phi 3$ from a vertical shift register 22 are respectively supplied to the gate electrodes of the transistors 23, 23′ and 23″. Pulse signals $\phi f1$ to $\phi 3$ from the vertical shift register 22 are respectively supplied to the gate electrodes of the transistors 25, 25′ and 25″.

Electrodes 10 of the photoelectric transducer cells 20 are commonly connected to horizontal lines 27, 27′ and 27″ in units of rows. Pulse signals $\phi 1$ to $\phi 3$ from the vertical shift register 28 are respectively supplied to the horizontal lines.

The emitter electrodes 9 of the photoelectric transducer cells 20 are commonly connected to vertical lines 29, 29′ and 29″ in units of columns. The vertical lines are respectively connected to an output line 34 through transistors 33, 33′ and 33″ for outputting serial readout signals from the photoelectric transducer cells.

The gate electrodes of the transistors 30, 30′ and 30″ are commonly connected to a terminal 31, and a pulse signal $\phi rs$ is applied to the terminal 31. Pulse signals $\phi h1$ to $\phi h3$ from a horizontal shift register 32 are respectively applied to the gate electrodes of the transistors 33, 33′ and 33″.

The output line 34 is grounded through a refresh transistor 36 and to the gate electrode of a signal amplification transistor 35. An amplified signal from the transistor 35 appears at a terminal 38.

The operation of the image pickup device having the arrangement described above will be described with reference to FIG. 5B.

The storage operation is performed until time t1. Holes corresponding to the amount of incident light are stored in the p-type base regions 4 of the photoelectric transducer cells 20. It should be noted that even if strong light is incident on some of the photoelectric transducer cells 20, the excessive holes are removed to the horizontal lines 27, 27′ and 27″ through the corresponding electrodes 10, thereby maintaining the vertical lines 29, 29′ and 29″ at zero potential in the floating state.

At time t1, the pulse signal $\phi r1$ rises, and the transistor 23 is turned on. Subsequently, the pulse $\phi r$ rises to supply the positive read voltage to the horizontal line 21. The photoelectric transducer cells 20 of the first row start reading. In this read operation, the read signals from the cells of the first row appear on the vertical lines 29, 29′ and 29″. When the read operation is completed, the transistor 36 is turned on in response to the pulse signal $\phi 1rs$, so that the residual charge in the output line 34 is refreshed.

At time t2, the pulse signal $\phi h1$ rises to turn on the transistor 33. The signal generated by the photoelectric transducer cell of the first row and the first column and appearing on the vertical line 29 is input to the transistor 35 through the transistor 33 and the output line 34. The amplified signal appears at the terminal 38. Upon completion of this output operation, the pulse signal $\phi 1rs$ rises to refresh the output line 34. Subsequently, the pulse signals $\phi h2$ and $\phi h3$ sequentially rise to output signals from the photoelectric transducer cell of the first row and the second column and the cell of the first row and third column to the output terminal 38. Every time an output appears on the output line 34, it is refreshed.

When the output operation is completed, the pulse signal $\phi 1$ from the vertical shift register 28 rises at time t3. The positive voltage is applied to the electrodes 10 of the photoelectric transducer cells 20 of the first row. Hole injection is then performed as described above.

Subsequently, at time t4, the pulse signals $\phi f1$ and $\phi rs$ rise to turn on the transistors 25, 30, 30′ and 30″, and the respective vertical lines are grounded. The pulse signal $\phi f$ then rises to apply the positive refresh voltage pulse to the horizontal line 21. As described above, the refresh operation is performed.

When the read, hole injection, and refresh operations of the photoelectric transducer cells 20 of the first row are completed, the storage operation is started at time t5.

The same operation as in the cells of the first row is started for the cells of the second row at time t5 and the cells of the third row at time t6. More specifically, by sequentially allowing the pulse signals $\phi r2$, $\phi 2$ and $\phi f2$ to rise, the photoelectrical transducer cells 20 of the second row are selected and subjected to the read, hole injection, and refresh operations. At time t6, upon storage operation of the cells of the second row at time t6, the pulse signals $\phi r3$, $\phi 3$ and $\phi f3$ sequentially rise, and the photoelectric transducer cells 20 of the third row sequentially rise are selected. Upon starting of the storage operation of the cells of the third row, the cells of the first row are selected, and the subsequent operations are performed in the same manner as described.

All read signals corresponding to the amounts of light incident on the photoelectric transducer cells 20 serially appear at the terminal 38. Since the storage time of the cells 20 of each row is predetermined, the image pickup device is applicable to a television video camera or the like.

FIG. 6A is a circuit diagram of an image pickup device using the embodiment described above, and FIG. 6B is a timing chart for explaining the operation thereof.

Referring to FIG. 6A, three photoelectric transducer cells 20 are arranged one-dimensionally, and collector electrodes 12 thereof are commonly connected. A positive voltage is applied to the collector electrodes 12. Capacitor electrodes 8 are commonly connected to a terminal 41 through a line 40. A pulse signal $\phi r$ is applied to the terminal 41 so as to perform read and refresh operations. Emitter electrodes 9 are connected to vertical lines 44, 44' and 44". Electrodes 10 of diodes are commonly connected to a horizontal line 42. The horizontal line 42 is connected to a control circuit 43, and is applied with a pulse signal $\phi i$ or grounded.

The vertical lines 44, 44' and 44" are grounded through transistors 45, 45' and 45", respectively. The gate electrodes of the transistors 45, 45' and 45" are commonly connected to a terminal 47 through a line 46. A signal $\phi rs$ is applied to the terminal 47.

Each of the vertical lines 44, 44' and 44" is connected to a corresponding one of the main electrodes of the transistors 48, 48' and 48". The gate electrodes of the transistors 48, 48' and 48" are commonly connected to a terminal 50 through a line 49. A signal $\phi t$ is applied to the terminal 50. The other main electrode of each of the transistors 48, 48' and 48" is grounded through a corresponding one of charge storage capacitors 51, 51' and 51", and is connected to an output line 54 through a corresponding one of transistors 53, 53' and 53".

The gate electrodes of the transistors 53, 53' and 53" are connected to parallel output terminals of a shift register 52, respectively. Signals $\phi h1$ to $\phi h3$ appear at the parallel output terminals, respectively.

The output line 54 is grounded through a refresh transistor 55 and connected to the gate electrode of a transistor 57 serving as an output amplifier. The gate electrode of the transistor 55 is connected to the terminal 56. A signal $\phi 1rs$ is applied to the terminal 56. An output terminal 58 of the transistor 57 is connected to an output terminal 60 through a capacitor and an amplifier 59.

The output terminal of the control circuit 43 is connected to a gain control terminal of the amplifier 59 so as to control a gain of the amplifier 59 in response to a signal from the horizontal line 42.

The operation of the image pickup device having the arrangement described above will be described with reference to FIG. 6B.

The pulse signals $\phi rs$ and $\phi 1rs$ are set at high level to turn on the transistors 45, 45', 45" and 55. The emitter electrodes 8 of the photoelectric transducer cells 20 and the output line 54 are grounded, and thus the residual charge of the output line 54 is removed.

At time t1, the pulse signal $\phi t$ rises to turn on the transistors 48, 48' and 48". The charge storage capacitors 51, 51' and 51" are grounded to remove the residual charge.

At time t2, the signal $\phi t$ and then the pulse signal $\phi i$ from the control circuit 43 rise. A positive voltage is applied to the horizontal line 42 until time t3. Holes are injected in the p-type base regions 4 of the photoelectric transducer cells 20 (hole injection operation).

At time t3, the pulse signal $\phi 1$ falls to set the horizontal line 42 at the ground potential. The pulse signal $\phi r$ rises to apply a positive refresh voltage to the capacitor electrode 8 of each photoelectric transducer cell 20. Since each electrode 8 is maintained at the ground potential, a refresh operation is performed, as described above. When the signal $\phi r$ rises at time t4, the p-type base region 4 of each photoelectric transducer cell 20 is set at the initial negative potential. Upon completion of the refresh operation, the signals $\phi rs$ and $\phi 1rs$ rise to turn off the transistors 45, 45', 45" and 55.

In this state, the holes of the electron-hole pairs excited by incident light are stored as optical information in the p-type base regions of the photoelectric transducer cells 20. The base potential of each photoelectric transducer cell is increased by the storage voltage component corresponding to the amount of light from the initial negative potential (storage operation).

When the storage operation is performed for a desired period of time, the horizontal line 42 is set in the floating state by the control circuit 43. The signal $\phi t$ is set at high level to turn on the transistors 48, 48' and 48", thereby respectively connecting the vertical lines 44, 44' and 44" and the charge storage capacitors 51, 51' and 51".

At time t5, the signal $\phi r$ rises to supply the positive read voltage to the capacitor electrodes 8 of the photoelectric transducer cells 20. The read operation as previously mentioned is performed, and thus the read signals corresponding to the optical information of the photoelectric transducer cells 20 are respectively stored in the charge storage capacitors 51, 51' and 51". At the same time, the read signals corresponding to the optical information of the photoelectric transducer cells 20 are output to the electrodes 10 through the corresponding diodes. However, since the electrodes 10 are commonly connected to the horizontal line 42 in the floating state, the read signal of the photoelectric transducer cell which has a largest amount of incident light appears as a peak voltage on the horizontal line 42. The control circuit 43 adjusts the gain of the amplifier 59 on the base of this peak voltage, thereby controlling the range of the read signals. The amplifier 59 serves as an automatic limiter.

Since the gain of the amplifier 59 is controlled, the signals $\phi r$ and $\phi t$ fall, and the pulse of the signal $\phi 1rs$ is applied to the terminal 56. The transistors 48, 48' and 48" are turned off, and the output line 54 is refreshed.

Subsequently, the shift register 52 is started from time t6. The read signals stored in the charge storage capacitors 51, 51' and 51" are sequentially output. The pulse signal $\phi hi$ output from the first output terminal of the shift register 52 rises to turn on the transistor 53. The read signal stored in the charge storage capacitor 51 is read out onto the output line 54. The readout signal is input to the gain-controlled amplifier 59 through the transistor 57 and is output from the terminal 60. Subsequently, when the signal $\phi h1$ falls, the signal $\phi 1rs$ rises to ground the output line 54 through the transistor 55, thereby removing the residual charge.

In the same manner as described above, the signals $\phi h2$ and $\phi h3$ output from the shift register 52 sequentially rise to read out the read signals from the charge storage capacitors 51, 51' and 51" onto the output line 54. Every time a signal is read out, the pulse signal $\phi 1rs$ rises to refresh the output line 54. In this manner, the read signals from the photoelectric transducer cells 20 are serially output from the gain-controlled amplifier 59. In the same manner as described above, the refresh, storage, and read operations are repeated. Every time a read operation is performed, the peak value is detected to adjust the gain of the amplifier 59.

FIG. 7A is an equivalent circuit diagram of a third embodiment of a photoelectric transducer device according to the present invention.

Referring to FIG. 7A, a p-type base region 703 of an npn bipolar transistor 701 is connected to a capacitor electrode 704 through a capacitor 702. The base region 703 is connected to the drain of a p-channel MOS transistor 707.

The operation of the transducer device having the arrangement described above will be described below.

In the storage operation, the p-type base region 703 is set in the initial negative potential, the emitter electrode 705 is set at zero potential in the floating state, and the capacitor electrode 704 is set at zero potential. Therefore, the collector electrode 706 is maintained at a positive potential. The gate electrode 708 of the p-channel MOS transistor 707 is set at a positive potential, and the p-channel MOS transistor 707 is rendered nonconductive. In this state, upon reception of light, carriers (holes in this case) corresponding to the amount light are stored in the p-type base region 703.

In the read operation, the emitter electrode 705 is set in the floating state, and a positive read voltage pulse is applied to the capacitor electrode 704. As previously mentioned, an electrical signal corresponding to the amount of incident light is read out to the emitter electrode 705.

In the hole injection operation, the capacitor electrode 704 is set at zero potential, the emitter electrode 705 is set in the floating state or at zero potential, and a source electrode 709 of the p-channel MOS transistor 707 is set at a proper potential, e.g., the ground potential. Assume that a negative pulse is applied to the gate electrode 708 of the p-channel MOS transistor 707. If the potential of the p-type base region 703 is lower than that of the source electrode 709 in the dark state or a state wherein an amount of light is small, the holes are injected into the p-type base region 703 to increase its potential. However, if the amount of incident light is large and at the same time the potential of the p-type base region 703 is higher than that of the source electrode 709, some of the holes stored in the p-type base region 703 are erased. The potential of the p-type base region 703 is set to be equal to that of the source electrode 709. The potential of the source electrode 709 is set such that the potential of the p-type base region 703 is sufficiently higher than the residual potential Vk even in the dark state.

In the refresh operation, the emitter electrode 705 is grounded, the gate electrode 708 of the p-channel MOS transistor 707 is set at a positive potential, and the p-channel MOS transistor 707 is rendered nonconductive. In this state, when the refresh pulse is applied to the capacitor electrode 704, the holes stored in the p-type base region 703 are recombined with the electrons injected from the emitter electrode 705 to the p-type base region 703, thus eliminating the holes. Since the potential of the p-type base region 703 is sufficiently high due to the hole injection operation even in the dark state, the initial base potential upon application of the refresh pulse is sufficiently higher than the residual potential Vk regardless of the amount of incident light (FIG. 2). Therefore, when the refresh time t0 has elapsed, the potential of the p-type base region 703 is set at the predetermined potential Vk regardless of the amount of incident light. In this state, when the positive refresh pulse falls, the p-type base region 703 is set at the predetermined initial negative potential.

By inserting the hole injection operation in the transducer cycle, the holes in the p-type base region 703 are not subjected to shortage even if the refresh operation is repeated. Therefore, nonlinearity of the photoelectric transducer characteristics and the after image phenomenon with a small amount of light can be completely prevented.

In the above embodiment, the base region as the control electrode has a p conductivity type, and thus the carriers are holes. However, if the base region as the main control electrode of a pnp bipolar transistor has an n conductivity type, the carriers are electrons.

In the above embodiment, the bipolar transistor having two main electrodes and a control electrode formed between the two main electrodes is used. However, another semiconductor element such as an FET or an SIT can also be used.

In the embodiment of FIG. 7A, the means for injecting the carriers in the p-type base region is a p-channel MOS transistor. However, other means may be used in place of the p-channel MOS transistor. For example, as shown in FIG. 7B, an n-channel MOS transistor may be used. As shown in FIG. 7C, an npn transistor 707" may be used. Alternatively, as shown in FIG. 7D, a pnp transistor 707''' may be connected to the p-type base region.

The means for injecting the carriers may be replaced with means for emitting an electromagnetic wave such as light (e.g., bias light) onto the photoelectric transducer device immediately prior to the refresh operation, thereby injecting the carriers.

The control means for controlling the potential of the control electrode region through the capacitor to dissipate the carriers (holes) stored therein is the means for grounding the emitter region, applying the refresh pulse to the capacitor electrode, and then injecting electrons from the emitter region, thereby recombining the electrons and the holes.

Photoelectric transducer cells as still another embodiment having the similar structure and operation to the one described above are arranged in a two-dimensional manner to constitute an image pickup device, and this image pickup device will be described with reference to FIGS. 8A and 8B.

FIG. 8A is a circuit diagram of the two-dimensional image pickup device, and FIG. 8B is a timing chart for explaining the operation thereof.

Referring to FIG. 8A, photoelectric transducer cells 810 are arranged to constitute a $3 \times 3$ matrix. Capacitor electrodes 804 of the photoelectric transducer cells 810 are commonly connected to horizontal lines 811, 811', and 811" in units of rows. The horizontal lines 811, 811', and 811" are connected to a terminal 814 through transistors 813, 813', and 813". A positive read/refresh voltage pulse $\phi R$ is applied to the terminal 814.

The gate electrodes of transistors 813, 813', and 813" respectively receive pulse signals $\phi v1$, $\phi v2$, $\phi v3$ from a vertical shift register 812. The gate electrodes 808 of the transistors 807 of the photoelectric transducer cells are commonly connected to horizontal lines 815, 815', and 815" in units of rows. These horizontal lines are connected to a terminal 817 through transistors 816, 816', and 816". A pulse $\phi F$ to be applied to the gate electrode 808 of the transistor 807 of each cell 810 is applied to the terminal 817.

The gate electrodes of the transistors 815, 185', and 815" respectively receive pulse signals $\phi c1$, $\phi c2$, and $\phi c3$ from the vertical shift register 812.

Source electrodes 809 of the transistors 807 of the photoelectric transducer cells are connected to a terminal 819 through horizontal lines 818, 818', and 818". A hole injection voltage Vc is applied to the terminal 819.

Emitter electrodes 805 of the photoelectric transducer cells 810 are commonly connected to vertical lines 820, 820', and 820" in units of columns. These vertical lines are grounded through refresh transistors 821, 821', and 821" and connected to an output line 825 through transistors 823, 823', and 823" for serially outputting the read signals from the photoelectric transducer cells.

The gate electrodes of the transistors 821, 821', and 821" are commonly connected to a terminal 822. A pulse signal $\phi vc$ is applied to the terminal 822. The gate electrodes of the transistors 823, 823', and 823" respectively receive pulse signals $\phi H1$, $\phi H2$, and $\phi H3$ from a horizontal shift register 824.

An output line 825 is grounded through a reset transistor 826 and connected to the gate of a signal amplification transistor 828. An amplified signal appears at a terminal 829. An output line reset pulse $\phi Hc$ is applied to a gate electrode 827 of the reset transistor 826.

The operation of the image pickup device having the arrangement described above will be described with reference to a timing chart of FIG. 8B.

The storage operation is performed until time t1. The holes corresponding to the amounts of incident light are respectively stored in the p-type base regions 803 of the photoelectric transducer cells 810.

At time t1, the pulse signal $\phi v1$ rises to turn on the transistor 813. Subsequently, the pulse $\phi R$ rises to apply a positive read voltage to the horizontal line 811, so that the read operation of the photoelectric transducer cells 810 of the first row is started. The read signals from the photoelectric transducer cells of the first row appear on the vertical lines 820, 820', and 820". Upon completion of the read operation, the transistor 826 is turned on in response to the pulse signal $\phi Hc$, and thus the residual charge of the output line 825 is refreshed.

At time t2, the pulse $\phi H1$ rises to turn on the transistor 823'. The signal from the photoelectric transducer cell of the first row and the first column is input to the transistor 828 through the transistor 823 and the output line 825. An amplified signal from the transistor 828 appears at the terminal 829. When this output operation is completed, the pulse $\phi Hc$ rises to refresh the output line 825. Subsequently, the pulse signals $\phi H2$ and $\phi H3$ sequentially rise to output signals from the cell of the first row and the second column and the cell of the first row and the third column. These signals appear at the terminal 829. Every time a read signal appears, the output line 825 is refreshed.

When the output operation is completed, the pulse $\phi Hc$ is applied to the gate electrodes 822 of the transistors 821, 821', and 821" to refresh the vertical lines 820, 820', and 820". Subsequently, the pulse signal $\phi c1$ from the vertical shift register 812 and then the pulse signal $\phi F$ are sequentially applied to the terminal 817. Therefore, the pulse is applied to the electrodes 808 of the transistors 807 of the cells 810 of the first row, and the hole injection operation as described above is performed.

At time t4, the pulse signals $\phi v1$ and $\phi F$ rise to turn on the transistor 813 and to supply the positive refresh voltage pulse to the horizontal line 811. The refresh operation is performed, as described above.

The same cycle as in the first row is repeated for the second row from time t5 and for the third row from time t6. More specifically, the pulse signals $\phi V2$, $\phi R$, $\phi Hc$, $\phi H1$, $\phi Hc$, $\phi H2$, $\phi Hc$, $\phi H3$, $\phi Vc$, and $\phi c2$ sequentially repeat rising/falling to select the photoelectric transducer cells 810 of the second row, and the read, hole injection, and refresh operations are performed. At time t6, the cells of the second row are subjected to the storage operation, and at the same time, the pulse signals $\phi v3$, $\phi R$, $\phi Hc$, $\phi H1$, $\phi Hc$, $\phi H2$, $\phi Hc$, $\phi H3$, $\phi vc$, and $\phi c3$ sequentially repeat rising/falling, thereby selecting the photoelectric transducer cells 810 of the third row. The same operation as described above is repeated for the third row. When the third row is subjected to the storage operation, the first row is selected and the above operation is repeated.

The read signals corresponding to the amounts of light incident on all the photoelectric transducer cells 810 are serially output at the terminal 829. Since storage time of the cells 810 of each row from the refresh operation to the read operation is predetermined, the image pickup device is applicable to a television video camera or the like.

In the above embodiment, the photoelectric transducer cells 810 are two-dimensionally arranged. The following embodiment will exemplify the case wherein cells are one-dimensionally arranged to constitute a line sensor.

FIG. 9A is a circuit diagram of an image pickup device having photoelectric transducer cells arranged in a one-dimensional manner, and FIG. 9B is a timing chart for explaining the operation of the image pickup device in FIG. 9A.

Referring to FIG. 9A, three photoelectric transducer cells 810 are one-dimensionally arranged. Collectors electrodes 809 are commonly connected and receive a positive voltage. Capacitor electrodes 804 are commonly connected to a terminal 831 through a horizontal line 830. A read/refresh pulse signal $\phi R$ is applied to the terminal 831. Emitter electrodes 805 are respectively connected to vertical lines 835, 835', and 835". A gate electrode 808 of the transistor 807 is connected to a terminal 833 through a horizontal line 832 and receives a pulse signal $\phi c$ for hole injection. A source electrode 809 of the transistor 807 is connected to a terminal 34 for receiving a hole injection voltage Vc.

The vertical lines 835, 835', and 835" are respectively grounded through transistors 836, 836', and 836". The gate electrodes of the transistors 836, 836', and 836" are commonly connected to a terminal 838 through a line 837. A signal $\phi vc$ is applied to the terminal 838.

The vertical lines 835, 835', and 835" are respectively connected to charge storage capacitors 840, 840', and 840" through transistors 839, 839', and 839" and to an output line 844 through transistors 843, 843', and 843". The gate electrodes of the transistors 839, 839', and 839" are commonly connected to a terminal 842 through a line 841. A signal $\phi T$ is applied to the terminal 842.

The gate electrodes of the transistors 843, 843', and 843" are connected to the parallel output terminals of a shift register 845. Signals $\phi H1$, $\phi H2$, and $\phi H3$ respectively appear at the parallel output terminals.

The output line 844 is grounded through a transistor 846 for refreshing the output line 844 and connected to the gate electrode of a transistor 848 serving as an output amplifier and having an output terminal 849. The gate electrode of the refresh transistor 846 is connected to a terminal 847. A signal $\phi Hc$ is applied to the terminal 847.

The operation of the image pickup device having the arrangement described above will be described with reference to FIG. 9B.

The pulse signals $\phi T$ and $\phi vc$ rise to turn on the transistors 839, 839', 839", 836, 836', and 836". The emitter electrodes 805 of the photoelectric transducer cells 810 and the vertical lines 835, 835', and 835" are grounded, thereby removing the residual charges from the charge storage capacitors 840, 840', and 840" and the vertical lines 835,, 835', and 835".

At time t1, the signal φc rises so that the potential Vc applied to the terminal 834 is set to be equal to the potential of the base region 803 of each photoelectric transducer cell 810. The holes are injected into the base region 803 of each photoelectric transducer cell 810 held in the dark state or receiving a small amount of light. As a result, the potentials at the base regions of the photoelectric transducer cells are set to be substantially equal to each other (hole injection operation).

At time t2, the signal φc falls and the signal φR rises to apply the positive refresh voltage to the capacitor electrodes 804 of the photoelectric transducer cells 810. Since the emitter electrodes are grounded, the refresh operation is performed in the same manner as in the previous embodiment. When the signal φR falls at time t3, the p-type base regions 803 of the photoelectric transducer cells 810 are reset in the initial negative potential state. When the refresh operation is completed, the signal φvc falls to turn off the transistor 836, 836′, and 836″.

At time t4, the signal φR rises again to apply the positive read voltage to the capacitor electrodes 804 of the photoelectric transducer cells 810. In this state, the holes of the electron-hole pairs excited by incident light are stored in the p-type base regions of the photoelectric transducer cells 810. The base potential of each cell is increased by the storage voltage component corresponding to the amount of light, and at the same time, the read operation is performed. The read signals corresponding to the optical information of the photoelectric transducer cells 810 are respectively stored in the charge storage capacitors 840, 840′, and 840″. The store operation in this case is conducted under the condition that respective cells are forward-biased between base and emitter thereof.

At time t5, the signals φT and φR fall to turn off the transistors 839, 839′, and 839″. The signal φHc rises to remove the residual charge from the output line 844, and then the signal φHc falls. The signal φH1 output from the first output terminal of the shift register 845 rises to turn on the transistor 834, so that the read signal stored in the charge storage capacitor 840 is read out onto the output line 844.

The readout signal appears at the terminal 849 through the transistor 848. Subsequently, the signal φHc rises, and the output line 844 is grounded through the transistor 846, thereby removing the residual charge.

In the same manner as described above, the signals 843′ and 843″ output from the shift register 845 sequentially rise to read out the read signals from the charge storage capacitors 840′ and 840″ onto the output line 844. Every time a read signal appears, the pulse signal φHc rises to refresh the output line 844. In this manner, the read signals from all the photoelectric transducer cells 810 serially appear at the terminal 849 through the transistor 848.

FIG. 9C is a timing chart for explaining another operation of the image pickup device in FIG. 9A.

FIG. 9C shows the operation mode wherein the signal φR which rises at time t2 does not fall at time t3, and other signal timings are the same as those in FIG. 9B. In the case of FIG. 9C, a store operation is conducted under the condition that respective cells are forward-biased between base and emitter thereof, the signals generated by the transistors 805 of the photoelectric transducer cells are always read out onto the vertical lines 835, 835′, and 835″. Such read operation can be allowed.

According to this timing, a noise taken in the sensor cells responsive to the falling and rising of the pulse φR, that is a fixed pattern noise due to an irregularity in configuration of cells of the capacitor electrode 4 and a random noise due to a carrier produced by depressing the interface between the oxidization film and the semiconductor under the capacitor electrode 4, is removed. Therefore, a fine signal without noise can be obtained.

FIG. 9D is a timing chart for explaining still another operation of the embodiment as shown in FIG. 9A.

FIG. 9D shows the operation mode wherein the signal φT which has not fallen at the time t3, falls at the time t3 and raises again at the time t4 at which the store operation is completed. Operation of other timings is the same as that of FIG. 9C. In the case of the operation as shown in FIG. 9D, during the store oeration, the signals produced at the transistors 805 of respective cells are read out to only the vertical lines 835, 835′, and 835″. In case of long time store operation, since the quantity of bias between base emitter of the transistors 805 in respective cells is reduced as the store time continues, emitter current of the transistor 805 also is reduced. Thereby, irregularity in operation of the cell produced in the low current region in the transistor 805 is as it is outputted as a signal to the vertical lines 835, 835′, and 835″. According to this timing, when the pulse φT raises again at time t4, the signals including the low current operation irregularity of the transistor 805 which has been read out to the vertical lines 835, 835′, and 835″ are only divided between the capacitors 840, 840′, and 840″ and a capacitors of wiring of the vertical lines 835, 835′, and 835″. Therefore, the voltage of the signals is dropped. Since the voltage of the vertical lines 835, 835′, and 835″ is dropped, the transistor 805 operates again. By the large emitter current, the signals stored in bases of respective cells can be read out to the capacitors 840, 840′, and 840″. Thereby, the signals including low current operation irregularity of the transistor 805 produced during the long store time are removed. Signals without operation irregularity of transistors of respective cells can be read out to the capacitors 840, 840′, and 840″.

In the photoelectric transducer device of this embodiment as described above, a transistor and the like is formed in the control electrode region of the semiconductor transistor, and thus the potential of the control electrode is controlled. Therefore, the carriers can be injected into the control electrode at the proper time. For example, the potential of the control electrode region can be kept sufficiently high at the beginning of refreshing. The potential of the control electrode region at the end of refreshing can be maintained at a desired predetermined value. The conventional nonlinearity of the characteristics and the after image phenomenon of the photoelectric transducer can be improved.

In particular, when the present invention is applied to the image pickup devices as shown in FIGS. 8A and 9A, unlike in the conventional control method, fixed pattern noise caused by variations of the capacitances inherent to the photoelectric transducer cells can be prevented. If the image pickup device picks up an image of an object, a video image with little noise can be obtained.

In the photoelectric transducer device of the embodiment as described above in detail, the control electrode region has a semiconductor region having the same conductivity type as that of the main electrode region of the semiconductor transistor and having a lower impurity concentration than that to constitute a diode structure. Therefore, a proper voltage is applied to the semiconductor region, and the carriers can be properly injected into the control electrode region. For this reason, the potential of the control electrode region can be sufficiently high at the beginning of refreshing. The potential of the control electrode region at the end of refreshing can be maintained at a desired predetermined value. That is, unlike in the conventional device, the after image phenomenon can be prevented.

In addition, even if strong light is incident upon the photoelectric transducer device, the excessive carriers can be eliminated through the diode structure. Therefore, the blooming phenomenon can also be prevented.

Since the peak value can be easily detected by the semiconductor region, there is easily provided an image pickup device having a light metering function.

What is claimed is:

1. A photoelectric converter for providing an output signal which varies as a function of light energy received thereby comprising:
    a transistor for accumulating carriers in response to received light energy, said transistor including a first semiconductor region, a second semiconductor region connected to an output circuit, and a third semiconductor region which is operatively associated with the first and second semiconductor regions;
    a carrier injection element electrically coupled to the third semiconductor region for injecting carriers into the third semiconductor region; and
    read-out means for reading out a signal dependent on the accumulated carriers;
    the third semiconductor region being coupled to a potential source which controls the potential of the third semiconductor region preferentially to the first and second semiconductor regions and which biases the junction between the third and second semiconductor regions during readout.

2. A converter according to claim 1 wherein the third semiconductor region is a base region and the second semiconductor region is an emitter region.

3. A converter according to claim 1, further comprising refresh means for extinguishing the accumulated carriers.

4. A converter according to claim 3, wherein the refresh means forward biases the junction of the third and second semiconductor regions to extinguish the accumulated carriers.

5. A converter according to claim 4, wherein the refresh means include a switching means for selectively connecting the second semiconductor region to a potential source to extinguish the carriers.

6. A converter according to claim 4, wherein the refresh means selectively connects the second semiconductor region to a reference potential to extinguish the accumulated carriers.

7. A converter according to claim 6, wherein the refresh means includes switching means for selectively connecting the second semiconductor region to the reference potential.

* * * * *